United States Patent
Higuchi et al.

(10) Patent No.: US 6,777,769 B2
(45) Date of Patent: Aug. 17, 2004

(54) LIGHT-RECEIVING ELEMENT, LIGHT-RECEIVING ELEMENT ARRAY AND LIGHT-RECEIVING MODULE AND METHOD FOR HIGH FREQUENCY CHARACTERISTICS

(75) Inventors: Takeshi Higuchi, Tokyo (JP); Naoki Tsukiji, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/287,675

(22) Filed: Nov. 5, 2002

(65) Prior Publication Data

US 2003/0085440 A1 May 8, 2003

(30) Foreign Application Priority Data

Nov. 6, 2001 (JP) ........................................ 2001-340844

(51) Int. Cl.[7] ...................... H01L 31/00; H01L 31/058; H01L 21/00
(52) U.S. Cl. ...................... 257/448; 257/436; 257/443; 257/446; 257/447; 257/460; 257/463; 257/466; 438/57; 438/69; 438/71; 438/72; 438/78; 438/98
(58) Field of Search .................................. 257/436, 443, 257/446, 447, 448, 460, 463, 466; 438/57, 69, 71, 72, 78, 98

(56) References Cited

U.S. PATENT DOCUMENTS

| | | | |
|---|---|---|---|
| 5,239,189 A | * | 8/1993 | Lawrence ..................... 257/81 |
| 6,213,650 B1 | * | 4/2001 | Moriyama et al. ............ 385/88 |
| 6,384,459 B1 | * | 5/2002 | Matsuda ..................... 257/435 |
| 2002/0113282 A1 | * | 8/2002 | Yoneda et al. .............. 257/436 |

* cited by examiner

*Primary Examiner*—Donghee Kang
(74) *Attorney, Agent, or Firm*—Oblon, Spivak, McClelland, Maier & Neustadt, P.C.

(57) ABSTRACT

A light-receiving element, comprises an absorption layer formed on a semiconductor substrate, a window layer formed on the absorption layer, a first electrode formed on the window layer, a second electrode formed on the window layer and electrically connected to the first electrode, and a diffusion region which is formed in the absorption layer and the window layer and is formed between the first electrode and the substrate and between the second electrode and the substrate.

7 Claims, 9 Drawing Sheets

| Configuration in present invention (diffusing Zn into pad part) ||
|---|---|
| P electrode structure | Epi-structure (light absorption layer) |
| InP+Ti/Pt/Au | Absorption layer 3μm |
| | Absorption layer 6μm |
| InGaAs+Ti/Pt/Au | Absorption layer 3μm |
| | Absorption layer 6μm |

LIGHT-RECEIVING ELEMENT, LIGHT-RECEIVING ELEMENT ARRAY AND LIGHT-RECEIVING MODULE AND METHOD FOR HIGH FREQUENCY CHARACTERISTICS

CROSS-REFERENCE TO RELATED APPLICATIONS

This application is based upon and claims the benefit of priority from the prior Japanese Patent Application No. 2001-340844, filed Nov. 6, 2001, the entire contents of which are incorporated herein by reference.

BACKGROUND OF THE INVENTION

1. Field of the Invention

The present invention relates to a light-receiving element, a light-receiving element array prepared by arranging a plurality of light-receiving elements, and a light-receiving module using the light-receiving element array.

2. Description of the Related Art

Conventionally, a planar light-receiving element using a semiconductor is known as a light-receiving element. The planar light-receiving element is represented as a "light-receiving element" in the specification. The conventional light-receiving element is constructed as described below.

An electrode on the negative side, which is referred to as a "cathode" herein later, is formed on one surface of a semiconductor substrate. On the other hand, a buffer layer (an InP layer, etc.), an absorption layer (an InGaAs layer, etc.), an (InP) window layer, a protective film and an electrode on the positive side, which is referred to as an "anode" herein later, are formed one by one on the other surface of the semiconductor substrate. The anode, which has an annular electrode (referred to as a "ring electrode", hereinafter), is connected to a pad electrode. The light incident from the light-receiving surface of the ring electrode is absorbed by the absorbing layer and is converted into an electric signal.

In the light-receiving element of the configuration described above, since a parasitic capacitance caused by the MIS (Metal-Insulator Semiconductor) structure is appeared in the pad electrode region, the capacitance of the entire light-receiving element increases. The increase in the capacitance of the light-receiving element gives rise to the problem that the response characteristics are lowered in, particularly, the high frequency region. Further, in a case that a load applied to the pad electrode is large in the bonding step, there is also a problem that the surface leakage current increases by breaking the protective film.

BRIEF SUMMARY OF THE INVENTION

An object of the present invention is to provide a light-receiving element, a light-receiving array and a light-receiving module whose response characteristics is improved and the surface leakage current is suppressed even in a case where the protective film is broken by the load applied to the pad electrode in the bonding step and to provide method for providing a light-receiving element having the high frequency characteristics.

To achieve above-mentioned object, the following means are measured.

A light-receiving element according to the first aspect of the present invention is characterized by comprising: an absorption layer formed on a semiconductor substrate; a window layer formed on the absorption layer; a first electrode formed on the window layer; a second electrode formed on the window layer and electrically connected to the first electrode; and a diffusion region being formed in the absorption layer and the window layer, the diffusion region being formed between the first electrode and the substrate and between the second electrode and the substrate. With this configuration, it is preferable a dielectric layer is formed between the diffusion layer and the second electrode.

A light-receiving element according to the second aspect of the present invention is characterized by comprising: an absorption layer formed on a semiconductor substrate; a window layer formed on the absorption layer; a first electrode formed on the window layer; a second electrode formed on the window layer and electrically connected to the first electrode; a diffusion layer being formed in the absorption layer and the window layer, the diffusion layer being formed between the first electrode and the substrate; and a dielectric layer formed between the window layer and the second electrode. With this configuration, it is preferable the diffusion layer is also formed between the dielectric layer and the substrate.

Preferable modes of the light-receiving element according to the first and second aspects are as follows.

(1) The semiconductor substrate is an n-type substrate. It is preferable that the substrate is made of InP or Si.

(2) The first electrode is a positive electrode (anode) and a ring electrode.

(3) The second electrode is a pad electrode.

(4) The window layer is an n-type layer.

(5) A thickness of the absorption layer is no less than 3 μm. It is preferable that the thickness of the absorption layer is 6 μm.

(6) The diffusion layer is light-receiving region in which Zn is diffused.

(7) A third electrode formed on a surface on which the absorption layer is not formed is further provided, and the third electrode comprises an opening for passing the light transmitted through the absorption layer.

(8) The third electrode is a negative electrode (cathode).

(9) A protective film formed on the window layer is further provided.

(10) The first electrode is connected to the window layer by penetrating the protective film.

(11) A cap layer (InGaAs, InGaP) formed between the window layer and the first electrode is further provided.

(12) In (11), the cap layer is formed apart form the protective layer formed on the window layer.

(13) The dielectric layer is made of $SiO_2$ or SiN or a stacked layer thereof.

(14) A cutoff frequency is equal to or more than 3 GHz in a case that the bias voltage is 1 V, or a cutoff frequency is equal to or more than 2.5 GHz in a case that the bias voltage is 0.5 V.

A light-receiving element array according to the third aspect of the present invention is characterized in that plurality of above-mentioned light-receiving elements are arranged to form an array, and is characterized by further comprising a trench formed between the adjacent light-receiving elements in a manner to extend to reach a position where the absorption layers are separated from each other.

A light-receiving module according to the fourth aspect of the present invention is characterized by comprising: the above-mentioned optical bench; and a package having an electrical wiring electrically connected to the light-receiving element, to fix the optical bench.

A method for manufacturing a light-receiving element according to the fifth aspect of the present invention is characterized by comprising: forming an absorption layer formed on a semiconductor substrate; forming a window layer formed on the absorption layer; forming a first electrode formed on the window layer; forming a second electrode formed on the window layer and electrically connected to the first electrode; and forming a diffusion region being formed in the absorption layer and the window layer, the diffusion region being formed between the first electrode and the substrate and between the second electrode and the substrate.

A method for manufacturing a light-receiving element according to the sixth aspect of the present invention is characterized by comprising: forming an absorption layer formed on a semiconductor substrate; forming a window layer formed on the absorption layer; forming a first electrode formed on the window layer; forming a second electrode formed on the window layer and electrically connected to the first electrode; forming a diffusion layer being formed in the absorption layer and the window layer, the diffusion layer being formed between the first electrode and the substrate; and forming a dielectric layer formed between the window layer and the second electrode.

A method for manufacturing a light-receiving element according to the seventh aspect of the present invention is characterized by comprising: step for forming an absorption layer formed on a semiconductor substrate; step for forming a window layer formed on the absorption layer; step for forming a first electrode formed on the window layer; step for forming a second electrode formed on the window layer and electrically connected to the first electrode; and step for forming a diffusion region being formed in the absorption layer and the window layer, the diffusion region being formed between the first electrode and the substrate and between the second electrode and the substrate.

A method for manufacturing a light-receiving element according to the eighth aspect of the present invention is characterized by comprising: step for forming an absorption layer formed on a semiconductor substrate; step for forming a window layer formed on the absorption layer; step for forming a first electrode formed on the window layer; step for forming a second electrode formed on the window layer and electrically connected to the first electrode; step for forming a diffusion layer being formed in the absorption layer and the window layer, the diffusion layer being formed between the first electrode and the substrate; and step for forming a dielectric layer formed between the window layer and the second electrode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 7A to 7C show a light receiving element according to a third embodiment of the present invention, wherein

FIGS. 12A, 12B-1 and 12B-2 show schematically the configuration of the measurement circuit;

DETAILED DESCRIPTION OF THE INVENTION

Figure 1A:
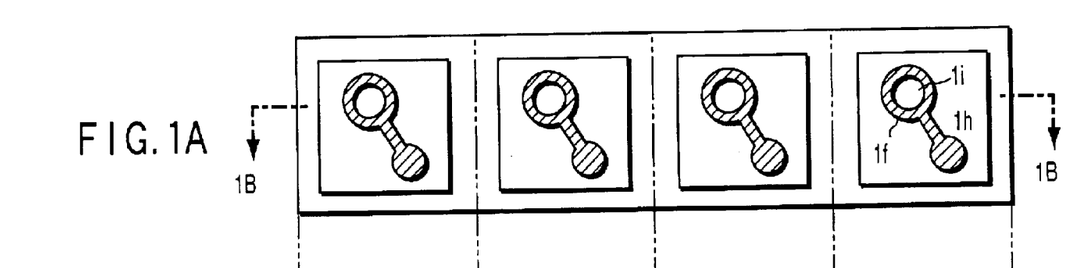
FIGS. 1A to 1C show a light-receiving element according to a first embodiment of the present invention.
Figure 1B:
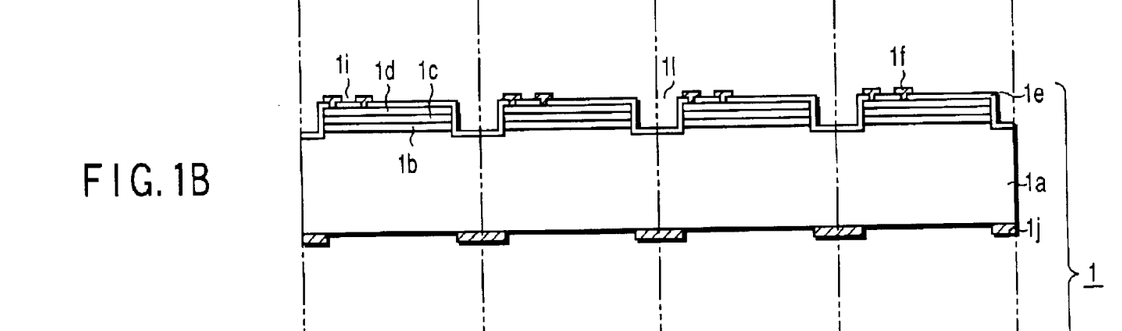
Figure 1C:
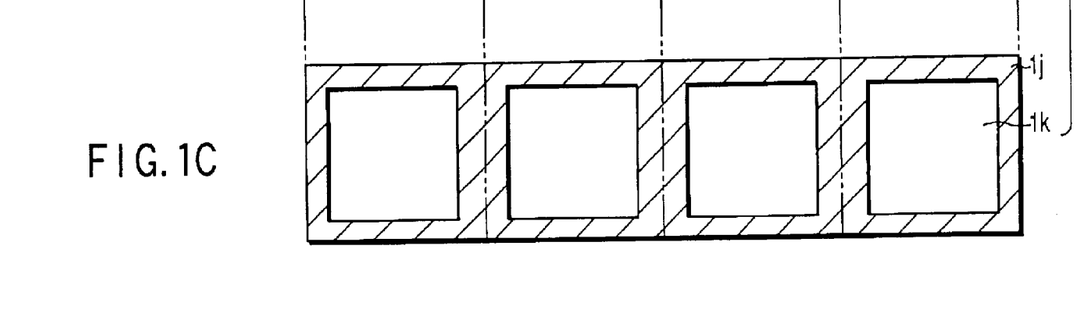
Figure 2A:
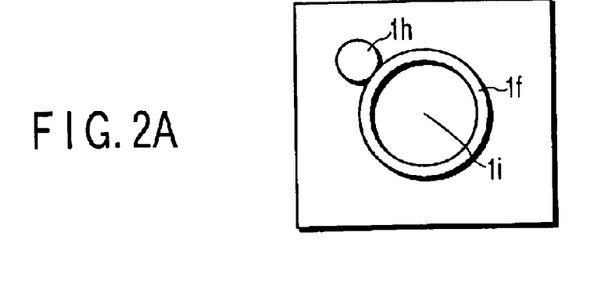
FIGS. 2A to 2D show a single light-receiving element used for explaining the light-receiving element according to the first embodiment of the present invention.
Figure 2B:
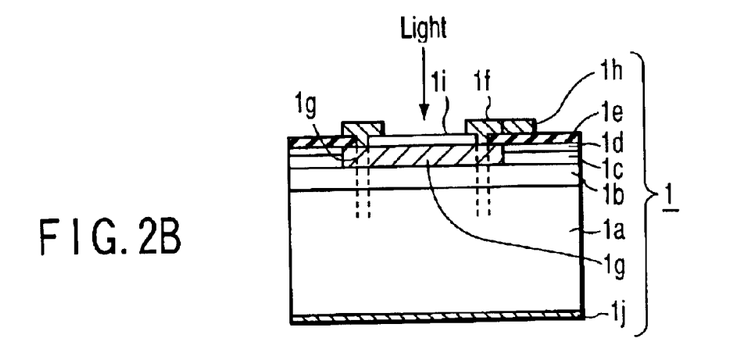
Figure 2C:
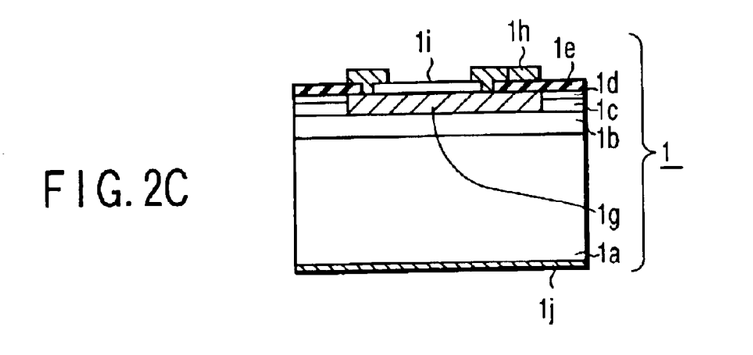
Figure 2D:
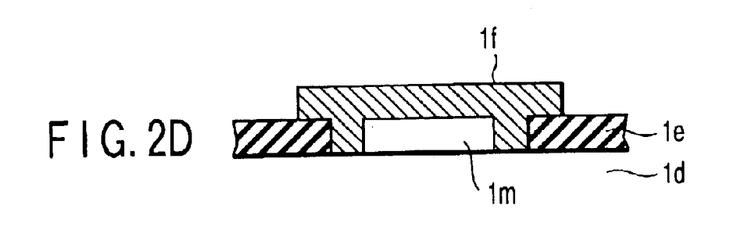
Figure 3:
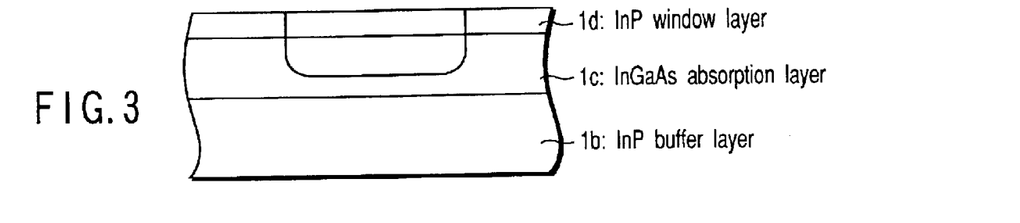
FIG. 3 shows a magnified figure of the light-receiving part shown in FIG. 2C.

Some embodiments of the present invention will now be described with reference to the accompanying drawings. FIGS. 1A to 1C show a light-receiving element according to a first embodiment of the present invention. FIG. 1A is a top view of the light-receiving element, FIG. 1B is a cross sectional view along the line 1B—1B shown in FIG. 1A, and FIG. 1C shows the light-receiving element as viewed from the side of the cathode. FIGS. 2A to 2D show a single light-receiving element used for describing the first embodiment of the present invention. FIG. 2A is a top view of the light-receiving element, FIG. 2B is a cross sectional view showing a conventional light-receiving element, FIG. 2C is a cross sectional view showing a light-receiving element according to the first embodiment of the present invention, and FIG. 2D shows a magnified figure of the contact part shown in FIG. 2C. FIG. 3 shows a magnified figure of the light-receiving part shown in FIG. 2C.

The light-receiving element 1 comprises a cathode 1*j* formed on a first surface, i.e., the lower surface shown in FIGS. 2B and 2C, of an n-type semiconductor substrate 1*a*.

Also, an n-InP buffer layer 1b, an i-InGaAs absorption layer 1c, an i-(or n)-InP window layer 1d, an SiN protective layer 1e and an anode 1f are formed one by one on a second surface, i.e., the upper surface shown in FIGS. 2B and 2C, of the semiconductor substrate 1a. A Zn diffusion layer 1g is formed in the InP window layer 1d and the InGaAs absorption layer 1c. In order to lower the resistance, it is preferable to form an InGaAs cap layer 1m at the contact portion between the Zn diffusion layer 1g and the anode 1f, as shown in FIG. 2D. The InGaAs cap layer 1m will be described later in detail. The InGaAs cap layer 1m and the SiN protective layer 1e are formed apart from each other in FIG. 2D. The configuration is effective to prevent the SiN protective layer 1e from being peeled off in the subsequent step. Also, the Zn diffusion layer 1g is formed to extend midway into the InGaAs absorption layer 1c, as shown in FIG. 3. By forming the window layer 1d in the n-type, the Zn diffusion in the lateral direction can be suppressed. The configuration described above is known in the art and, thus, the detailed description will be omitted in respect of the function of each of the layers.

The anode 1f is a ring electrode. A light-receiving surface (hereinafter called as "light receiving region", too) 1i is formed inside the anode (ring electrode) If. The light is incident from the light-receiving surface 1i and is converted into an electric signal in the Zn diffusion region 1g. Also, a pad electrode 1h is formed adjacent to the anode 1f. The pad electrode 1h is electrically connected to the anode 1f. A wire (not shown in the figure) is connected to the pad electrode 1h.

Figure 4:
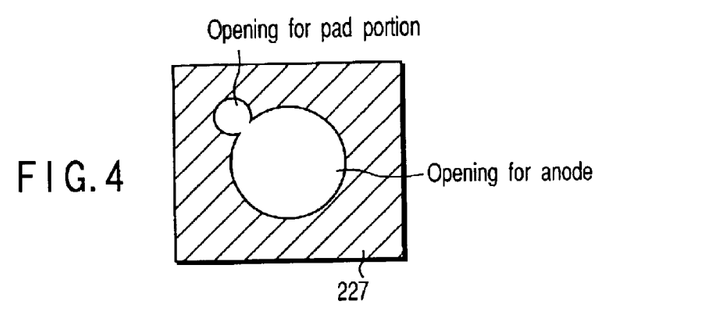
FIG. 4 shows an example of a mask to form a diffusion region according to the present invention.

In the configuration described above, the diffusion region 1g is formed only between the anode 1f and the InP buffer layer 1b but the diffusion region 1g is not formed between the pad electrode 1h and the InP buffer layer 1b, as shown in FIG. 2B. In the first embodiment of the present invention, however, the diffusion region 1g is also formed between the pad electrode 1h and the InP buffer layer 1b, as shown in FIG. 2C. The manufacturing method of the light-receiving element 1 is known in the art, and, thus, the drawing showing the manufacturing method and the description thereof will be omitted. Briefly speaking, the diffusion region 1g may be formed by diffusing Zn by the gaseous phase or solid phase diffusion after forming the absorption layer 1c and the InP window layer 1d. in this case, it is preferable to form the diffusion region 1g by using the mask as shown in FIG. 4, when, for example, the diffusion region 1g is formed. In FIG. 4, it is illustrated to use a mask in which the shapes of the anode 1f and the diffusion region 1g below the pad electrode 1h become the same shapes of each electrode. However, the shape of the mask is not limited. For example, the mask defining the shape of the diffusion region 1b below the pad electrode 1h may be circular, or polygonal such as rectangular or hexagonal.

Figure 5A:
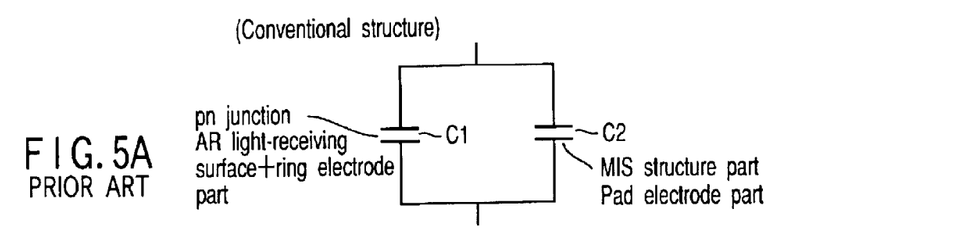
FIGS. 5A and 5B are the drawings used for describing the effect of the present invention.
Figure 5B:
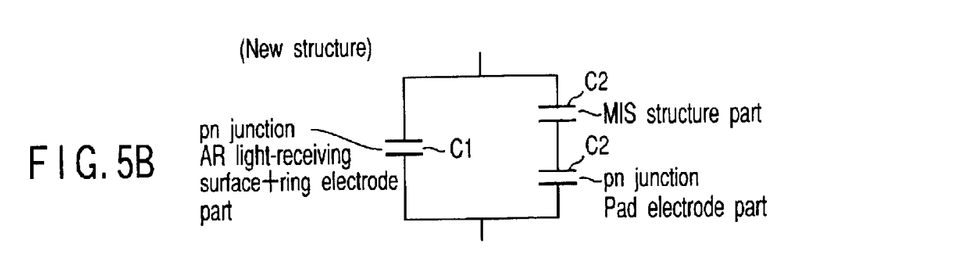

The effect by forming the diffusion region 1g is formed between the pad electrode 1h and the InP buffer layer 1b will be described with reference to FIGS. 5A and 5B. FIGS. 5A and 5B show the capacitance between the substrate 1a and the anode 1f (including the pad electrode 1h).

In the conventional configuration shown in FIG. 5A, the capacitance C is equal to the sum of the capacitance C1 between the substrate 1a and the anode if, i.e., the capacitance by the pn junction, and the capacitance C2 between the substrate 1a and the pad electrode 1h, i.e., the capacitance by the MIS structure. In other words, the capacitance C is equal to the sum of C1 and C2, i.e., C=C1+C2. In the first embodiment of the present invention shown in FIG. 5B, however, the diffusion region 1g is also formed between the pad electrode 1h and the InP buffer layer 1b. Therefore, the capacitance between the pad electrode 1h and the substrate 1a becomes a capacitance when the capacitance C2 by the MIS structure and the capacitance C3 by the pn junction are connected in series. Therefore, the capacitance C between the pad electrode 1h and the substrate 1a is obtained as:

$$1/C=1/C2+1/C3.$$

In other words, $$C=C1+C2\times C3/(C2+C3).$$

As apparent from the above equation, the capacitance C is markedly lowered. For example, the capacitances for the prior art and the first embodiment are obtained under the condition that the diameter of the light-receiving surface is 100 μm, the width of the ring of the anode 1f is 15 μm, and the diameter of the pad electrode 1h is 50 μm. With this condition, the capacitances are:

Prior Art: about 3.5 pF, and

First Embodiment: about 0.78 pF.

As mentioned-above, the capacitance between the anode 1f and the substrate 1a in the first embodiment lowers to about ⅕ of the capacitance in the prior art. The capacitance is calculated by assuming that the relative dielectric permittivity of SiN is 7.5, the dielectric permittivity of InP is 12.35, and the relative dielectric permittivity of vacuum is 8.85×$10^{-12}$. In this case, it is known that, since the time constant of the circuit is proportional to (resistance)×(capacitance), i.e., time constant τ∝R·C, the capacitance becomes smaller, the response becomes faster. For example, the response frequency f is given as follows:

$$f=1/(2\pi R\cdot C).$$

If the resistance of the circuit is assumed to be, for example, 10 Ω, the capacitance between the anode 1f and the substrate 1a is 0.78 pF. When C is assumed to be equal to 0.8×$10^{-12}$, the response frequency f is obtained as:

$$f \approx 1.99 \times 10^{10} (Hz)$$
$$= 19 \text{ GHz}$$

In practice, the capacitance of, for example, the package is added to the above-mentioned capacitance. Therefore, the cutoff frequency defined by the CR time constant is expected to be about 1/10 of the value given above, and becomes about 2 GHz. On the other hand, in the prior art, since the capacitance is about 5 times as much as that of the first embodiment, thus, the cutoff frequency becomes 0.4 GHz, which is about ⅕ of the value in the first embodiment. The response characteristics can be drastically improved by the first embodiment.

Further, since the diffusion region 1g is formed below the pad electrode 1h, since a pn junction is formed below the pad electrode 1h by the diffusion region 1g, the leakage current has only the dark current component even in the case where the protective film 1e is broken by applying a load to the pad electrode 1h in the bonding step. According to the first embodiment, the effect that the increase in the generation of the leakage current on the surface of the light-receiving element can be suppressed can be obtained.

As shown in FIG. 1B, a trench 11 is formed between the adjacent light-receiving elements and the light-receiving elements are separated from each other by the trench 11. The trench 11 is formed to extend to reach at least the absorption layer 1c in order to prevent the crosstalk. Also, the SiN protective layer 1e is formed on the exposed portion. The trench 11 may be vacant or may be filled with an insulating material.

In the configuration described above, it is preferable for the absorption layer 1c to have a thickness equal to or more than about 3 µm. In view of the manufacturing cost, it is unpreferable for the absorption layer 1c to have an excessively large thickness. More specifically, it is preferable for the absorption layer 1c to have a thickness within a range of between 3 µm and 8 µm. Where the absorption layer 1c has a thickness of 3 µm, the absorptance is about 95%. Also, where the absorption layer 1c has a thickness of 6 µm, the absorptance is about 99.8%. Since the light is absorbed substantially completely by the absorption layer 1c in the case where the absorption layer 1c has a thickness of 6 µm, it is possible to suppress the generation of the crosstalk. However, where the absorption layer 1c has a thickness of 3 µm, it is necessary to prevent the transmitted light, which has not been absorbed by the absorption layer 1c, from being reflected by the cathode 1j in order to suppress the crosstalk. Therefore, it is preferable to form an opening 1k in the cathode 1j in order to transmit the light that has not been absorbed by the absorption layer 1c, as shown in FIG. 1C.

Figure 6:
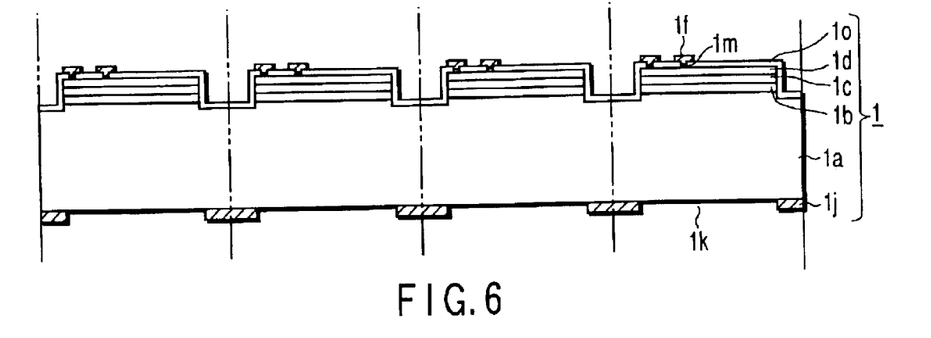
FIG. 6 is a cross sectional view showing a light-receiving element according to a second embodiment of the present invention.

FIG. 6 is a cross sectional view showing a light-receiving element according to a second embodiment of the present invention. The top view and the bottom view of the light-receiving element according to the second embodiment of the present invention are equal to those of the light-receiving element according to the first embodiment of the present invention and, thus, the drawings showing the second embodiment and the description thereof will be omitted.

The second embodiment differs from the first embodiment in that the cap layer 1m is formed at the contact part between the anode 1f and the InP window layer 1d. The resistance at the contact part can be decreased by using a material having a bandgap Eg smaller than that of the InP window layer 1d. In this sense, it is preferable to use InGaAs (Eg=0.75 eV) or InGaAsP (Eg=0.75 eV to 1.35 eV) for forming the cap layer 1m. The diffusion region in the second embodiment is equal to that in the first embodiment and, thus, is omitted from the drawing shown in FIG. 6.

Figure 7A:
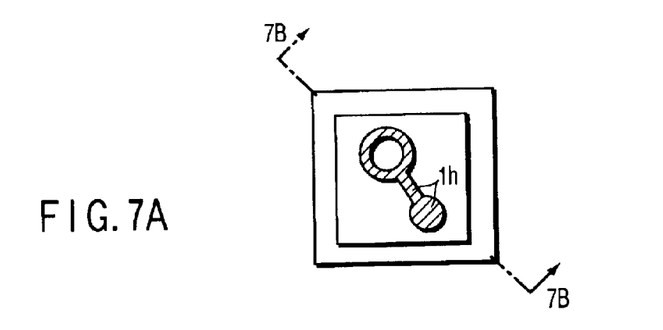
FIG. 7A is a top view showing a single light-receiving element.
Figure 7B:
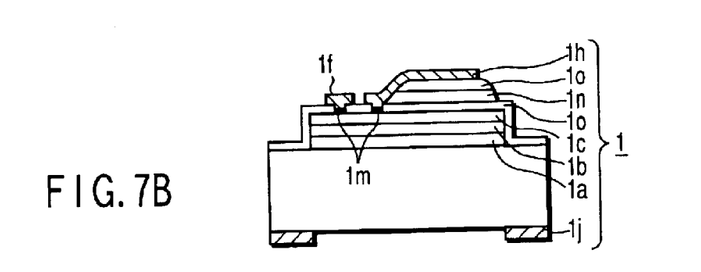
FIG. 7B is a cross sectional view along the line 7B—7B shown in FIG. 7A.
Figure 7C:
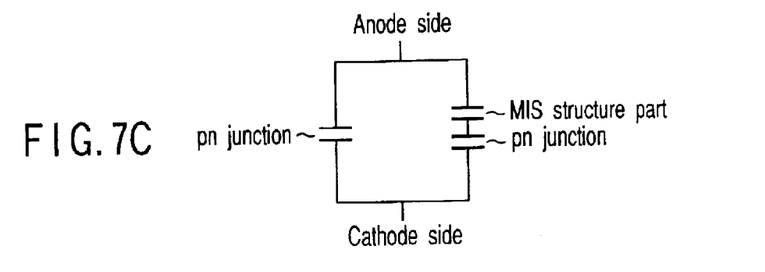
FIG. 7C shows an equivalent circuit of the structure shown in FIG. 7A.

FIGS. 7A to 7C show a third embodiment of the present invention. FIG. 7A is a top view showing a single light-receiving element, FIG. 7B is a cross sectional view along the line 7B—7B shown in FIG. 7A. The diffusion region in the third embodiment is equal to that in the first embodiment and, thus, is omitted from the drawing shown in FIGS. 7A and 7B.

In the third embodiment, an SiN layer 1o, an SiO$_2$ layer 1n and an additional SiN layer 1o are formed one by one between the pad electrode 1h and the protective film 1e in order to further decrease the capacitance between the pad electrode 1h and the substrate 1a. According to the configuration, the capacitance can be further decreased since the SiO$_2$ layer 1n and the SiN layer 1o constitutes an equivalent circuit configuration to a circuit in which capacitors are connected in series. FIG. 7C shows the equivalent circuit in this case. In the third embodiment, a diffusion region need not be formed below the stack structure (dielectric layer) of the SiN layer 1o, the SiO$_2$ layer 1n and the additional SiN layer 1o as in the first embodiment.

Figure 8A:
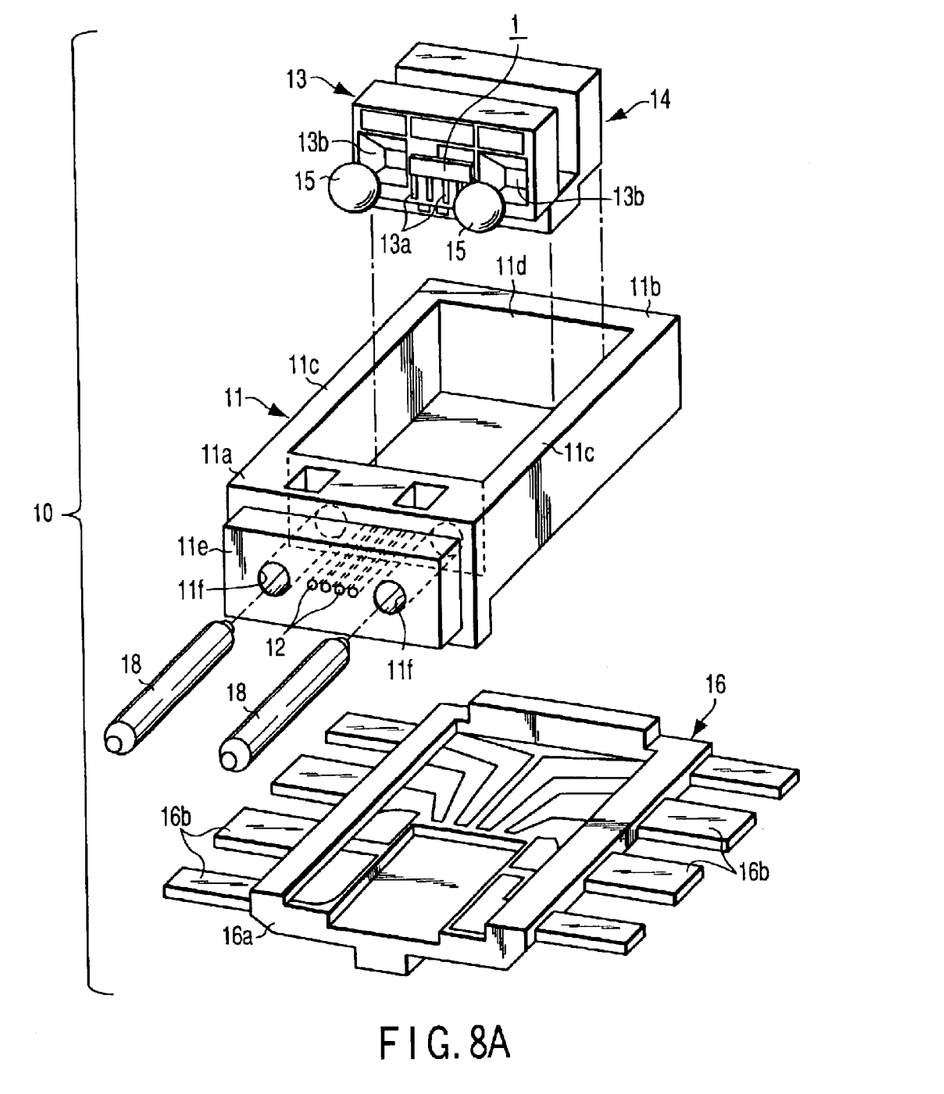
FIG. 8A is an exploded perspective view of a light-receiving module using a light-receiving element (or light-receiving array) of the present invention.
Figure 8B:
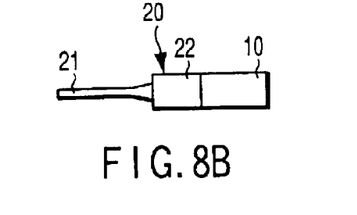
FIG. 8B is a plan view showing the connection structure between the light-receiving module and a light connector.

The light-receiving element 1 of the configuration described above can be used in, for example, a light-receiving module of the configuration described below. FIG. 8A is an oblique view showing an exploded perspective view of a light-receiving module 10 using the light-receiving element (or light-receiving element array) of the present invention. Also, FIG. 8B is a plan view showing the connection configuration between the light-receiving module and a light connector.

As shown in FIG. 8A, the light-receiving module 10 comprises a ferrule 11, an optical bench 13, wiring parts 14 for electrical connection, tow poles 15 and a lead frame 16.

The ferrule 11 is a rectangular cylindrical part having an arranging portion 11d consisting of a rectangular opening defined in the center by a front wall 11a, a rear wall 11b and side walls 11c. A projecting portion 11e is formed in the front wall 11a. Two pin holes 11f each penetrating the front wall 11a and the projecting portion 11e are formed at both sides of the ferrule 11. Also, an optical fiber 12 such as a single mode fiber or a grated index fiber is adhered and fixed to each of four fiber holes formed between two pin holes 11f. One end portion of the optical fiber 12 is set to have a length equal to the distance between the front surface of the projecting portion 11e and the inner surface of the front wall 11a.

The optical bench 13 can be formed of a material that permits transmitting the light incident on the light-receiving element 1. For example, it is possible to use a ceramic material, silicon or a resin molding material for forming the optical bench 13. However, in order to prevent the light leaking from the light-receiving element 1 from being reflected on the surface, it is preferable for the optical bench 13 to be formed of a material capable of transmitting or absorbing the light such as silicon, a transparent material or a black material. It is also preferable to form a reflection preventing portion such as a hole for transmitting the light or a concave portion for absorbing the light. In the example shown in FIG. 8A, the substrate 1a consisting of a transparent material of silicon is used for forming the optical bench 13. The light-receiving element 1 is mounted on the center of the front surface of the optical bench 13, and a predetermined lead pattern 13a is formed on the front surface of the optical bench 13. Also, the optical bench 13 includes two concave portions 13b, each having a reversed truncated pyramidal shape, formed on both sides of the light-receiving element 1 on the front surface.

A lead wire (not shown) is formed to project from the rear surface in the wiring part 14 for electrical connection.

The pole 15 is arranged between the pin hole 11f that is opened on the inner surface of the front wall 11a and the concave portion 13b and positions the optical fiber 12 corresponding to the light-receiving region 11 of the light-receiving element 1.

The lead frame 16 has a frame 16a to which a lead pattern is formed and lead terminals 16b extending along the width direction from the tip of the frame 16a.

In the light-receiving module 10 as configured above, the front surface of the light-receiving element 1 is bonded to the inner surface of the front wall 11a of the ferrule 11 with a light transmitting adhesive. Also, the wiring part 14 for electric connection, the two poles 15 and the lead frame 16 are sealed to the ferrule 11 with a synthetic resin injected from above the arranging portion 11d.

Also, the light-receiving module 10 is aligned with and connected to a light connector such as an MT (Mechanical Transferable) connector having pin holes formed in the corresponding positions through guide pins 18 inserted into the pin holes 11f. FIG. 8 shows a light connector 20. As shown in the drawing, the light connector 20 includes an optical fiber 21 and a light connector ferrule 22 fixed to the edge portion of the optical fiber 21. The optical fiber 21 is fixed to the optical connector ferrule 22 with an adhesive. In the light-receiving module 10, the signal light transmitted by the plural optical fibers of the light connector is incident on the corresponding light-receiving region 11 of the light-receiving element 1 through the corresponding optical fiber 12 and is output from the anode 1f as a photocurrent.

Experiment

In order to verify the effect of the embodiments of the present invention, a light-receiving element and a light-receiving element array are manufactured on the trial basis, and the performances thereof are measured. More specifically, it has been experimentally confirmed that the cutoff frequency is markedly improved because of the configuration specified in the present invention.

Figures 9, 10:
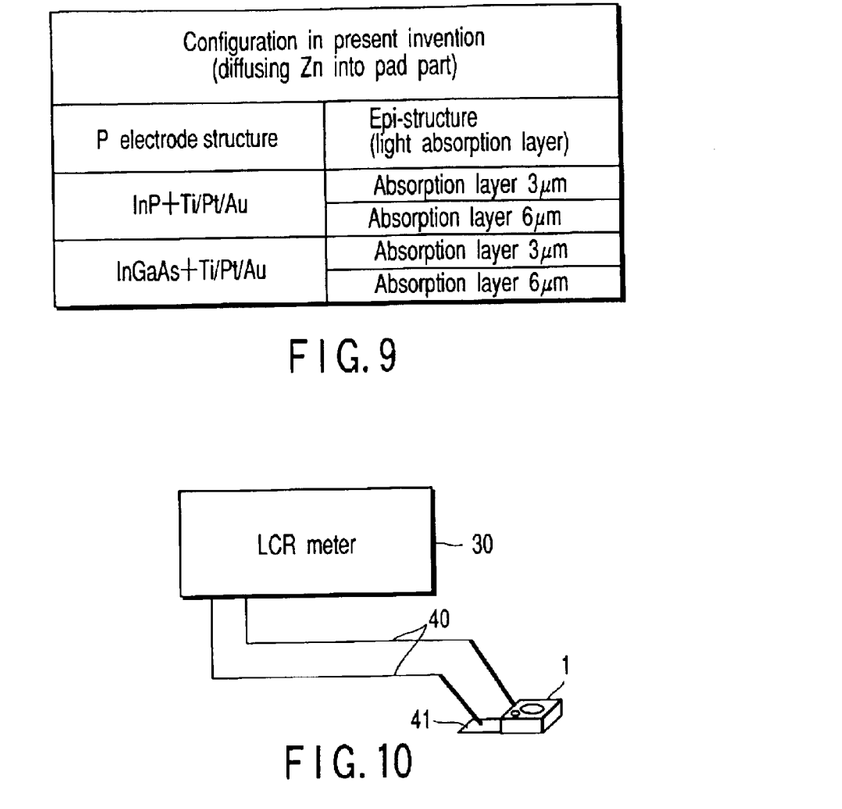
FIG. 9 shows an example of the trial manufacture in a case where the configuration of the measured sample is changed.
FIG. 10 schematically shows the configuration of the measurement circuit.

FIG. 9 shows the light-receiving elements manufactured on the trial basis by changing the configuration of the measuring sample. Each of the light-receiving elements shown in FIG. 9 has a configuration specified in the present invention. Specifically, the diffusion region 1g is also formed between the pad electrode 1h and the InP buffer layer 1b as shown in FIG. 2C in each of the light-receiving elements shown in FIG. 9.

The samples shown in FIG. 9 include two kinds of the electrode structure consisting of the InP+Ti/Pt/Au (without a cap layer) and the InGaAs+Ti/Pt/Au (with a cap layer). Also, each of the electrode structure is combined with an absorption layer having a thickness of 3 μm and with an absorption layer having a thickness of 6 μm, thereby four kinds of samples are prepared as shown in FIG. 9. With the above-mentioned configuration, when a cap layer is provided, since the contact resistance lowers, the resistance affects the frequency characteristics. Also, since the capacitance is determined in accordance with the thickness of the absorption layer, the capacitance also affects the frequency characteristics.

FIG. 10 schematically shows the configuration of the measurement circuit. As shown in FIG. 10, the light-receiving element 1 manufactured under the conditions shown in FIG. 9 is mounted on a silicon substrate, and the capacitance of the light-receiving element is measured while changing the bias voltage by setting the frequency applied to the light-receiving element at 1 MHz. A conductive plate connected to the cathode is connected to the rear surface of the light-receiving element 1, and the cathode and the anode are connected to an LCR meter 30 via wirings 40.

Figure 11:
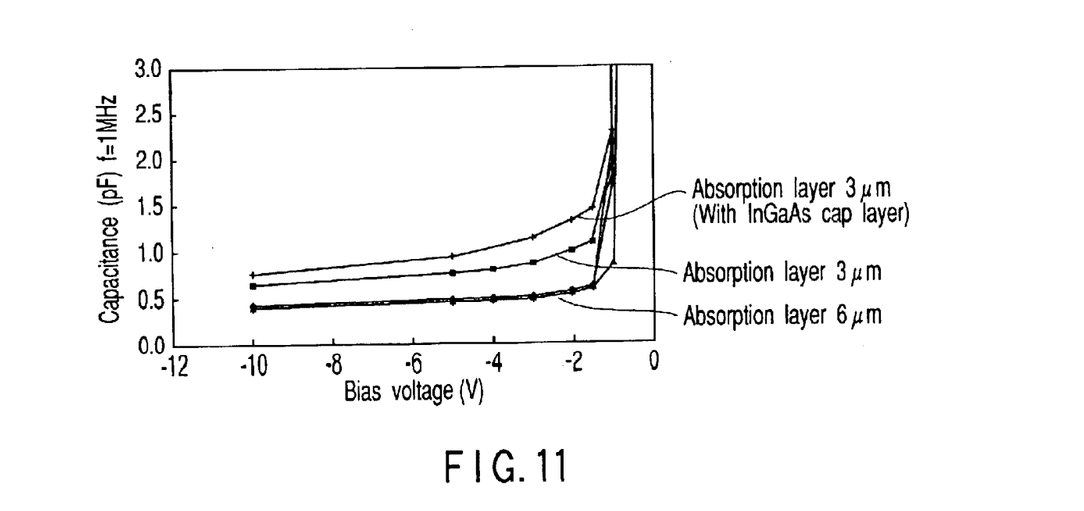
FIG. 11 is a graph showing the relationship between the bias voltage and the capacitance measured by the measurement circuit shown in FIG. 10.

FIG. 11 is a graph showing the relationship between the bias voltage and the capacitance measured by the measurement circuit shown in FIG. 10. In the graph of FIG. 11, the capacitance (pF) is plotted on the ordinate, with the bias voltage (V) being plotted on the abscissa. When the absorption layer has a thickness of 6 μm, the relationship between the bias voltage and the capacitance is substantially the same regardless of the presence or absence of the cap layer. Therefore, FIG. 11 simply indicates "absorption layer; 6 μm".

FIG. 11 shows that the capacitance is small in the case where the absorption layer has a thickness of 6 μm, and is large in the case where the absorption layer has a thickness of 3 μm. Therefore, it is considered reasonable to understand that, in the configuration of the light-receiving element of the present invention, it is preferable for the absorption layer to have a thickness of 6 μm, compared with the case where the absorption layer has a thickness of 3 μm. When the absorption layer has a thickness of 3 μm, the presence of the cap layer causes the capacitance to be increased. It is considered reasonable to understand that the difference in the capacitance is caused by the nonuniformity in the data produced by the difference in the diffusing conditions of Zn.

It is considered reasonable to understand that, if the Zn diffusing conditions are the same, substantially the same results can be obtained basically regardless of the presence or absence of the cap layer.

Figure 12A:
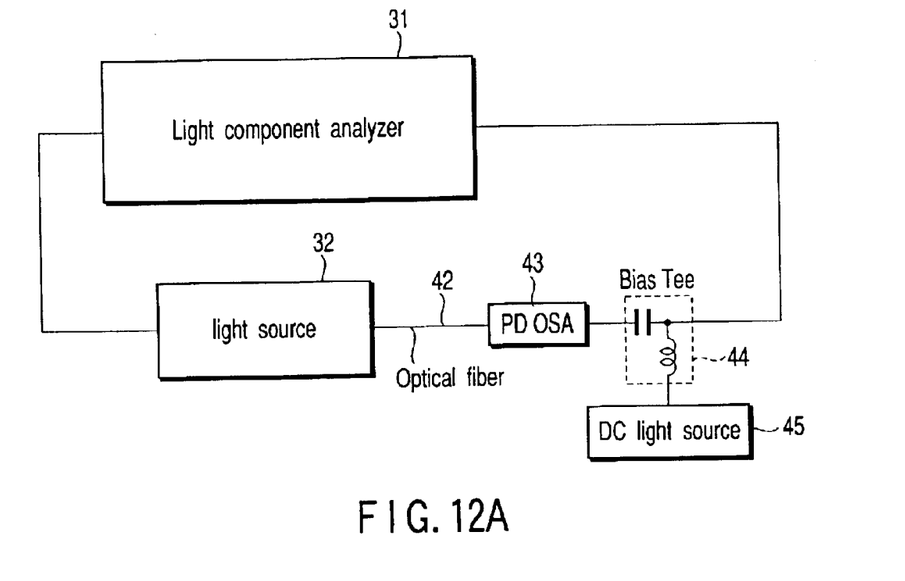
Figure 12B:
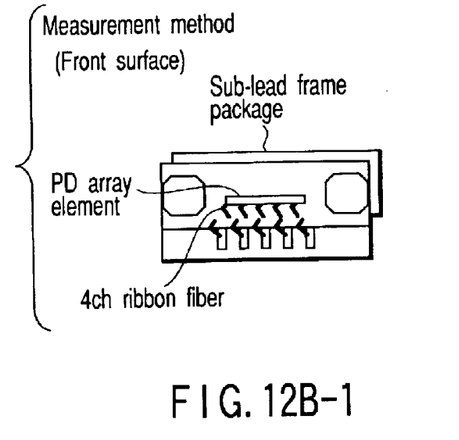
Figure 12B:
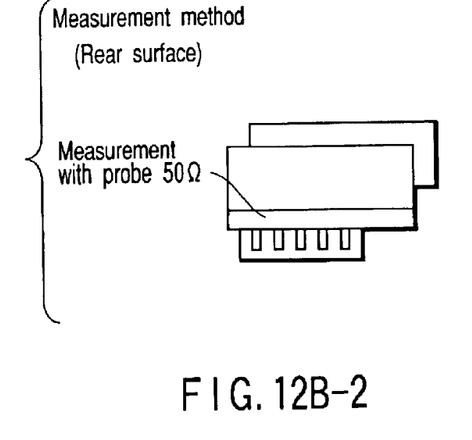

Then, in order to measure the response characteristics of the frequency of the light-receiving element, the applied frequency is changed by applying a predetermined bias voltage to the light-receiving element. FIGS. 12A, 12B-1 and 12B-2 schematically show the configuration of the measurement circuit. As shown in FIG. 12A, the light emitted from a light source 32 is incident on a light-receiving element part 43 through an optical fiber 42, and the output from the light-receiving element is measured by a light component analyzer 31 via a bias tee 44. The bias tee 44 has a capacitor and a coil, and a variable bias voltage is applied from a DC power source 45 to one edge side of the coil. FIGS. 12B-1 and 12B-2 show the specific connection between the optical fiber 42 and the light-receiving element. When FIG. 12B-1 is a front view of a package having the light-receiving element array mounted thereto, and FIG. 12B-2 is a rear view of the package noted above. As shown in FIG. 12B-1, the light-receiving element array in this case has four channels, and the light emitted from the light source is incident on the light-receiving surface of the light-receiving element through the optical fiber 42. The incident light is subjected to a photoelectric conversion within the light-receiving element and is output from the wiring (probe) arranged on the rear surface to the bias tee 44, and the result of the output is measured in the light component analyzer 31. In the experiment, the applied bias voltages are 0V, 1V, 2V and 3V, and the frequency is set to within a range of between 300 kHz and 6 GHz.

Figure 13A:
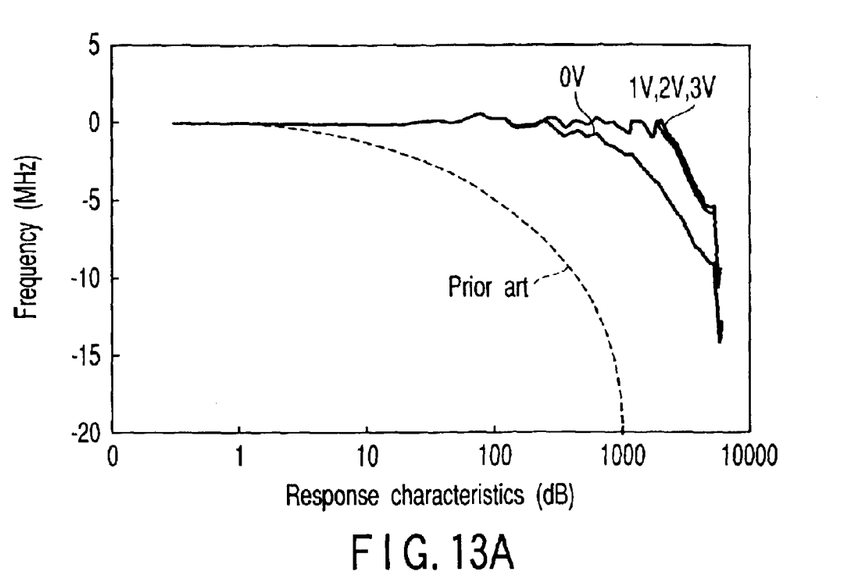
FIGS. 13A and 13B are graphs showing the measurement results by using the measurement circuits shown in FIGS. 12A, 12B-1, 12B-2.
Figure 13B:
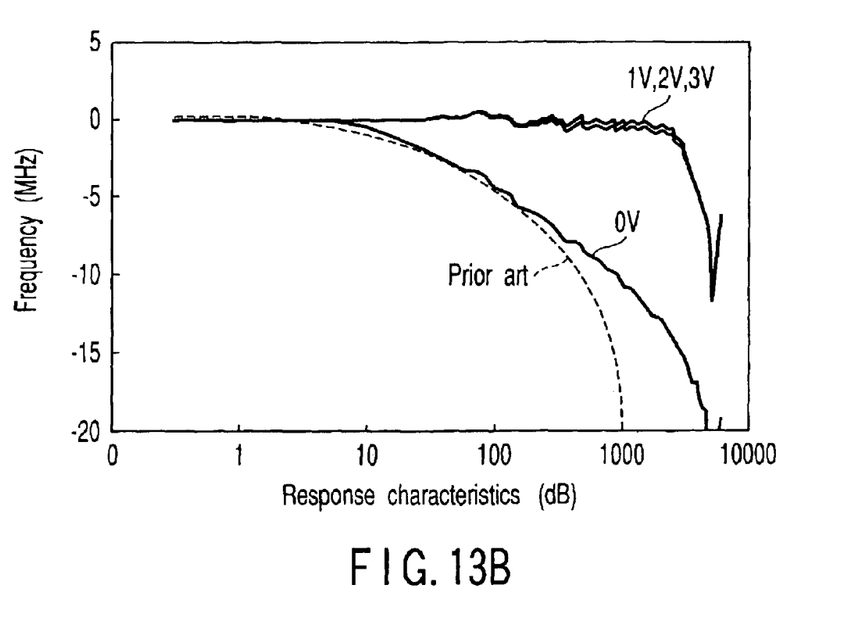

FIGS. 13A and 13B are graphs each showing the measurement result by using the measurement circuit described above under the above-mentioned measuring conditions. More specifically, each of FIGS. 13A and 13B is a graph showing the response characteristics under the bias voltages of 0V, 1V, 2V and 3V. In the graph of each of FIGS. 13A and 13B, the response characteristics are plotted on the ordinate, and the frequency is plotted on the abscissa. The response characteristics under the bias voltage of 1V to 3V are found to be substantially equal to each other and, thus, the curves under the bias voltage of 1V to 3V are shown in each of FIGS. 13A and 13B. As apparent from FIGS. 13A and 13B, the response characteristics are improved, compared with the prior art, in each of the cases where the cap layer is formed (FIG. 13A) and is not formed (FIG. 13B). More specifically, the cutoff frequency is not lower than 3 GHz in the present invention under the bias voltage of 1V. Also, if the bias voltage is set at 0.5 V, the cutoff frequency is expected to be not lower than 2.5 GHz. For example, if the characteristics for the prior art are denoted by broken lines in each of FIGS. 13A and 13B, the cutoff frequency for the prior art is only about 100 MHz (standard value being −3 dB). In other words, it can be clearly seen that, in the present invention, the response characteristics is drastically improved compared with the prior art.

Figure 14:
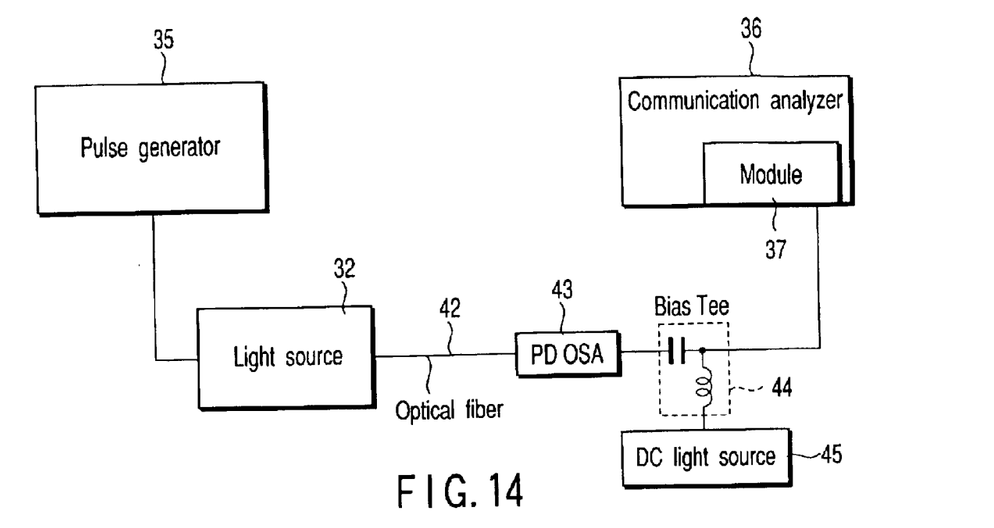
FIG. 14 schematically shows the configuration of the measurement circuit.

Then, the waveform is observed by using a measurement circuit shown in FIG. 14. The measurement circuit shown in FIG. 14 is basically equal to that shown in FIGS. 12A, 12B-1 and 12B-2, except that, in the measurement circuit shown in FIG. 14, a pulse generator 35 is arranged on the input side of the light source 32 and that a module 37 and a digital communication analyzer 36 for the signal analysis are arranged on the output side of the bias tee 44 for observing the wave form. Also, the connection between the optical fiber 42 and the light-receiving element is the same as that shown in FIGS. 12B-1 and 12B-2, and thus, the drawing and the description thereof will be omitted in respect of the connection between the optical fiber 42 and the light-receiving element.

Figure 15A:
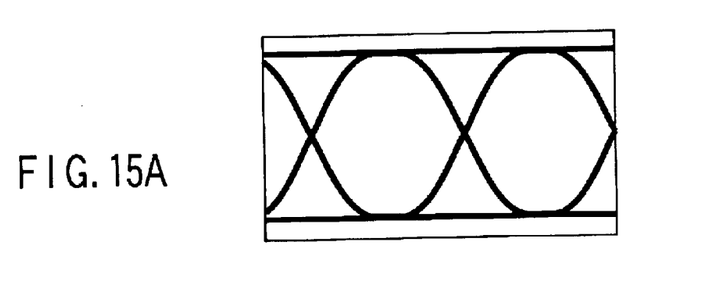
FIGS. 15A and 15B show the measurement results by using the measurement circuit shown in FIG. 14.
Figure 15B:
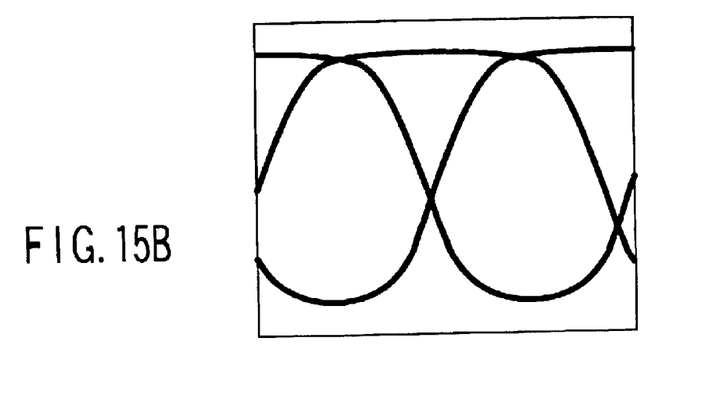

FIGS. 15A and 15B show the waveforms obtained by using the measurement circuit shown in FIG. 14. FIG. 15A covers the case where a contact layer is formed, and FIG. 15B covers the case where a contact layer is not formed. In this case, the frequency is set at 3.2 GHz, and the bias voltage is set at 3 V. As apparent from FIGS. 15A and 15B, in the light-receiving element of the present invention, it is possible to transmit the signal without distortion even in the case where the frequency is set at 3.2 GHz. Therefore, it is possible to provide a light-receiving element with good characteristics, compared with the prior art according to the invention.

The present invention is not limited to the embodiments described above.

For example, a Si substrate may be used in place of the InP substrate as the substrate 1a. The case of using the Si substrate differs from the case of using the InP substrate in only the absorbed wavelength region, and the similar effect can be obtained by applying the present invention thereto.

Also, in the embodiment described above, the diffusion region is formed to extend reach midway of the absorption layer. However, the diffusion layer may also be formed in a manner to extend to reach the boundary between the absorption layer and the buffer layer.

Needless to say, the present invention can be carried out in variously modified fashions within the scope of the present invention.

As described above, according to the present invention, it is possible to provide a light-receiving element, a light-receiving array and a light-receiving module whose response characteristics is improved and the surface leakage current is suppressed even in a case where the protective film is broken by the load applied to the pad electrode in the bonding step.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A light-receiving element, comprising:

an absorption layer formed on a semiconductor substrate;

a window layer formed on the absorption layer;

a first electrode formed on the window layer;

a second electrode formed on the window layer and electrically connected to the first electrode; and a diffusion region being formed in the absorption layer and the window layer, said diffusion region being formed between the first electrode and the substrate and between the second electrode and the substrate, wherein an outer edge of the second electrode and an outer edge of a portion of the diffusion region below the second electrode are substantially coincident.

2. The light-receiving element according to claim 1, wherein the window layer is an n-type layer.

3. The light-receiving element according to claim 1, wherein the absorption layer has the thickness of no less than 3 $\mu$m.

4. The light-receiving element according to claim 1, further comprising a third electrode formed on a surface on which the absorption layer is not formed, wherein the third electrode comprises an opening for passing the light transmitted through the absorption layer.

5. The light-receiving element according to claim 1, further comprising a cap layer formed between the window layer and the first electrode.

6. A light-receiving element array comprising:

a plurality of the light-receiving elements described in claim 1, said plurality of the light-receiving elements being arranged to form an array; and a trench formed between the adjacent light-receiving elements in a manner to extend to reach a position where the absorption layers are separated from each other.

7. A light-receiving module, comprising:

an optical bench on which the light-receiving element array defined in claim 6 is arranged; and a package having an electrical wiring electrically connected to the light-receiving element, to fix the optical bench.

* * * * *